US008353255B2

(12) United States Patent
Beyer et al.

(10) Patent No.: US 8,353,255 B2
(45) Date of Patent: Jan. 15, 2013

(54) DEVICE FOR COATING A SUBSTRATE

(75) Inventors: Ralph Beyer, Mühlacker (DE); Stefan Lutter, Nürtingen (DE); Rainer Targus, Vaihingen (DE)

(73) Assignee: Süss MicroTec Lithography GmbH, Garching (DE)

( * ) Notice: Subject to any disclaimer, the term of this patent is extended or adjusted under 35 U.S.C. 154(b) by 315 days.

(21) Appl. No.: 12/658,077

(22) Filed: Feb. 2, 2010

(65) Prior Publication Data
US 2010/0192843 A1    Aug. 5, 2010

(30) Foreign Application Priority Data

Feb. 3, 2009   (DE) .......................... 10 2009 007 260

(51) Int. Cl.
*B05C 11/02* (2006.01)
*B05C 13/00* (2006.01)

(52) U.S. Cl. ........................ 118/52; 118/500; 118/612

(58) Field of Classification Search .................... 118/52, 118/612, 319, 320, 56, 500, 326; 396/604, 396/611, 627; 427/240
See application file for complete search history.

(56) References Cited

U.S. PATENT DOCUMENTS

| | | | |
|---|---|---|---|
| 5,718,763 A | 2/1998 | Tateyama et al. | 118/52 |
| 5,762,709 A | 6/1998 | Sugimoto et al. | 118/52 |
| 5,803,968 A | 9/1998 | Schwartz et al. | 118/52 |
| 6,306,455 B1 | 10/2001 | Takamori et al. | 427/8 |
| 6,576,055 B2 | 6/2003 | Shirley | 118/52 |
| 2001/0003965 A1 | 6/2001 | Sada et al. | 118/63 |
| 2004/0053147 A1 | 3/2004 | Ito | 430/30 |
| 2004/0180141 A1 | 9/2004 | Kobayashi et al. | 427/240 |
| 2008/0176172 A1* | 7/2008 | Funakoshi et al. | 430/313 |

FOREIGN PATENT DOCUMENTS

DE  10 2007 033 226 A1   1/2009

OTHER PUBLICATIONS

Patent Abstracts of Japan; Japanese Patent Publication No. 02149367 A, published Jun. 7, 1990.
German Patent Office Search Report of May 12, 2009 in German priority Patent Application No. 10 2009 007 260.8.

* cited by examiner

*Primary Examiner* — Yewebdar Tadesse
(74) *Attorney, Agent, or Firm* — Ohlandt, Greeley, Ruggiero & Perle, LLP; George W. Rauchfuss, Jr.

(57) ABSTRACT

By means of the device for coating a substrate (2; 102) according to the present invention, a homogeneous coating of the substrate (2; 102) can be achieved. The device comprises a holding and rotating means for holding and rotating the substrate (2; 102) about an axis (A). A disk (3) is provided below the substrate (2; 102). Said disk (3) is arranged coaxially with respect to the substrate (2; 102), has at least the same diameter as the substrate (2; 102) and is able to rotate synchronously with the substrate (2; 102). By means of the disk (3), air swirls at the edge of and below the substrate (2; 102) are avoided during coating of the substrate (2; 102). Thus, it is possible to obtain a homogeneous coating. For being able to load and unload a substrate (2; 102) into and out of the device by means of a conventional gripper system (6), the distance between substrate (2; 102) and disk (3) is increased during loading and unloading.

12 Claims, 2 Drawing Sheets

DEVICE FOR COATING A SUBSTRATE

FIELD OF THE INVENTION

The present invention relates to a device for coating a substrate by spinning-off the coating material. It relates in particular to a device in which a contamination of the edges and the rear surfaces of the substrates can be prevented during the coating process and in which a uniform coating is achieved.

BACKGROUND TO THE INVENTION

DE 10 2007 033 226 A1 discloses an aerodynamic spinning process for applying liquid layers, realized as a single wafer apparatus which comprises at least one air flow device and at least one holding and moving device. Further technological background is disclosed in US 2001/0003965 A1, DE 10 2004 011 850 B4, U.S. Pat. No. 6,576,055 B2, U.S. Pat. No. 6,306,455 B1, U.S. Pat. No. 5,803,968 A, U.S. Pat. No. 5,762,709 A, U.S. Pat. No. 5,718,763 A, JP 2004/072120 A, and JP 02149367 A.

In normal devices for coating substrates, the substrates are rotated and at the same time the substance by means of which the substrate is to be coated is applied to the substrate. The rotating movement causes the substance, e.g. a lacquer, to distribute on the substrate. When spinning the substance off, air swirls are caused at the edge of the substrate or at the lower side of the substrate. These air swirls cause contamination of the edges and/or rear sides. A homogeneity of the layer thickness of the substance of less than 20% on the substrate is hardly possible.

In view of the above-mentioned problems of the prior art, it is the object of the present invention to provide a device for coating substrates in which the homogeneity of the layer thickness of the substance on the substrate can be improved. Moreover, an automated loading and unloading of the substrates into and out of the device by means of conventional gripper systems, such as finger, fork or edge grippers, is provided. These objects of the invention are achieved by the features of the claims.

SUMMARY OF THE INVENTION

In achieving these objects, the invention starts out from the following basic idea: Below the substrate to be coated, there is provided a disk which is arranged coaxially with respect to the substrate and has at least the same diameter as the substrate. When adjusting a relatively small distance between substrate and disk, air swirls can be avoided during the coating process. This increases the homogeneity of the coating. For being able to load and unload substrates into and out of the substrate coating device by means of conventional gripper systems, the distance between substrate and disk is increased during loading and unloading.

The device for coating a substrate comprises a holding and rotating means for holding and rotating the substrate about an axis extending essentially perpendicularly with respect to the substrate plane. Below the substrate there is provided a disk which is arranged coaxially with respect to the substrate and has at least the same diameter as the substrate. When the distance between substrate and disk is small, air swirls can be avoided at the edge and the lower side of the substrate. This leads to an improved homogeneity of the coating on the substrate. The distance between the substrate and the disk can be varied by means of a distance varying means. This allows to load and unload substrates into and out of the device by means of a conventional gripper system. When using a means for rotating the disk, the disk can rotate synchronously with the substrate about the same axis.

The distance varying means can be configured such that it projects through a hole in the disk along the common axis of substrate and disk. The distance between substrate and disk can be varied in that the distance varying means is elongated or configured so as to be axially movable relative to the disk. Alternatively, a disk holder can move the disk along the distance varying means in the axial direction, in order to thus vary the distance between substrate and disk. The distance varying means can be configured as holding and rotating means.

The holding and rotating means for the substrate can comprise a centering pin for engagement with an axial bore of the substrate. The centering pin can be provided in the center of the support surface on which the substrate rests. The support surface can be formed by the end surface of the distance varying means. A possible alternative holding and rotating means for the substrate comprises a support surface on a first side of the substrate and a counter surface on a second side of the substrate. The support surface can be formed by the end surface of the distance varying means. By means of the counter-surface, which has a smaller diameter than the substrate to be coated, a pressure is applied to the second surface of the substrate, so that the substrate is clamped between contact surface and counter surface. The force acting on the substrate from both sides is thus applied essentially coaxially with respect to the substrate.

During coating of the substrate, the distance between substrate and disk is relatively small in order to prevent air swirls at the edge of the substrate and at the lower side of the substrate, and is preferably 0.1 to 0.3 mm, particularly preferably 0.2 mm.

BRIEF DESCRIPTION OF THE DRAWINGS

In the following, the invention will be explained in more detail with reference to the schematic illustrations in the drawings in which.

DETAILED DESCRIPTION OF THE INVENTION

Figure 1A:
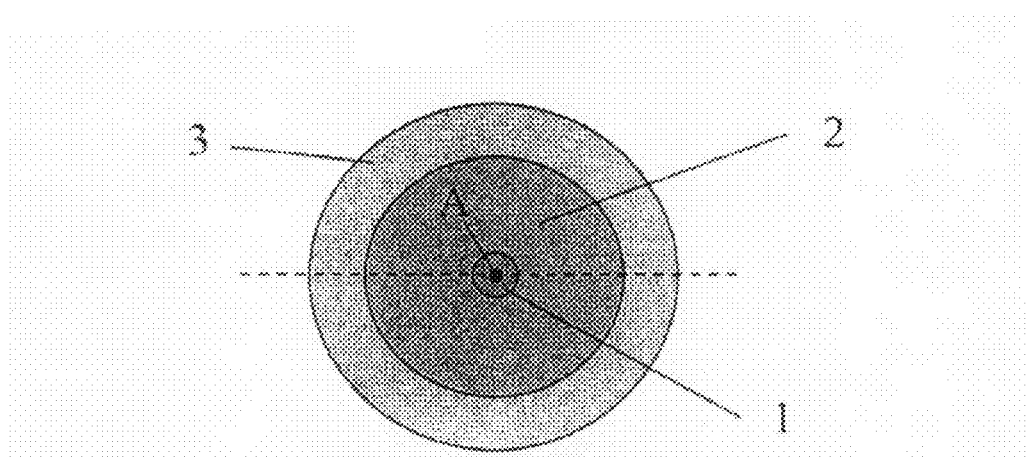
FIG. 1a shows a top view of a substrate coating device according to the invention.

According to FIG. 1a, the device comprises a centering pin 1 and a disk 3 with the substrate 2 to be coated. Centering pin 1, substrate 2 and disk 3 are arranged coaxially with respect to the axis A. The substrate 2 to be coated can be a wafer, a CD, DVD or the like having a hole in the center. In this case, the centering pin 1 extends into the hole of the substrate 2 or through the hole.

Figure 1B:
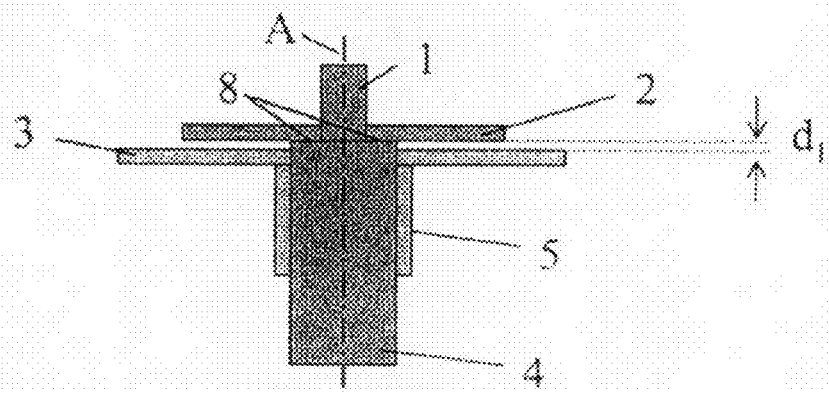
FIG. 1b is a sectional view along the dashed line of FIG. 1a, with disk and substrate being relatively close together.

FIG. 1b shows a section through FIG. 1a along the dashed line. The substrate 2 is held by the centering pin 1 and the support surface 8 on which the substrate 2 rests. The support surface 8 is formed by an end surface of the means 4 for varying the distance between substrate 2 and disk 3. The axis A about which the substrate 2 is rotated during the coating process (e.g. lacquering) is shown as dash-dotted line in FIG. 1b. Below the distance varying means 4 for varying the distance between substrate 2 and disk 3 there is provided a motor (not shown in FIG. 1b) which can rotate the distance varying means 4 and thus also the substrate 2 and the centering pin 1. A disk 3 is arranged below the substrate 2. The diameter of the disk 3 is at least the same as the diameter of the substrate 2. During the coating process, the distance $d_1$ between substrate 2 and disk 3 is, e.g., 0.1 to 0.3 mm, preferably 0.2 mm. The disk 3 is held by the disk holder 5. The disk holder 5 can be held by the distance varying means 4. The disk 3 can be rotated synchronously with the substrate 2. In this case, the disk holder 5 can be connected rigidly with the distance varying means 4.

Because of the small distance $d_1$ between substrate 2 and disk 3, air swirls at the edge of and below the substrate 2 can be avoided. Without disk 3, these air swirls would cause contamination of the edge and the rear surface. A homogeneous coating (lacquering) of the substrate with layer thickness tolerances of less than 20% would hardly be possible in this case. Such air swirls can also be influenced by a housing (not depicted in FIG. 1b) which surrounds the shown device. During spinning-off the coating (lacquer), the disk 3 prevents air swirls. No air stream is caused which draws the coating (lacquer) downwards at the edge of the substrate and might lead to contamination of the edge and the rear surface. The disk 3 allows a thickness homogeneity of the coating of less than 3% because no air swirl causes the coating (lacquer) to accumulate at the edge of the substrate.

The disk 3 has at least the same diameter as the substrate 2 to be coated (lacquered). As discussed above, the distance between substrate 2 and disk 3 is relatively small, e.g. 0.2 mm. Thus, it is not possible to load and unload substrates 2 in an automated manner into and out of a coating device without any additional measures by means of normal wafer end effectors (finger or fork grippers) or by means of normal edge grip end effectors (edge grippers). Therefore, the present invention provides a lifting mechanism by means of which the distance between substrate 2 and disk 3 can be increased so much that an automated loading and unloading by means of conventional gripper systems is possible.

Figure 1C:
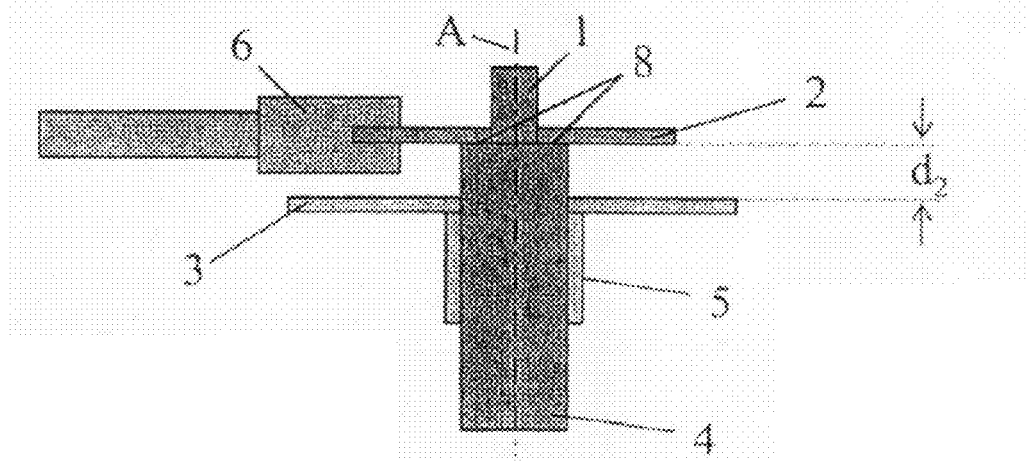
FIG. 1c is a sectional view similar to that of FIG. 1b at a time point at which a gripper system lifts the substrate from the device or places it onto the device.

FIG. 1c exemplarily shows how a substrate 2 is loaded and unloaded into and out of the device of the present invention by means of a conventional gripper system 6 which grips the substrate 2 at the substrate edge (edge gripper). The distance varying means 4 for varying the distance between substrate 2 and disk 3 can be elongated or moved relative to the disk. By doing so, it is possible to increase the distance between the substrate 2 and the disk 3 to $d_2$ (see FIG. 1b and FIG. 1c). Then, it is possible to load and unload a substrate 2 into and out of the device according to the invention as shown in FIG. 1c. Alternatively, the disk holder 5 including the disk 3 can be moved along the distance varying means 4 in order to increase the distance $d_1$ between substrate 2 and disk 3 to the distance $d_2$.

In case the device according to the invention is located in a housing (not shown in FIGS. 1b and 1c), it can be advantageous to move both the substrate 2 and the disk 3 upwards (beyond the edge of the housing). This can simplify loading and unloading the substrate 2 into and out of the device. To this end it is of course necessary to additionally increase the distance between substrate 2 and disk 3.

Figure 2A:
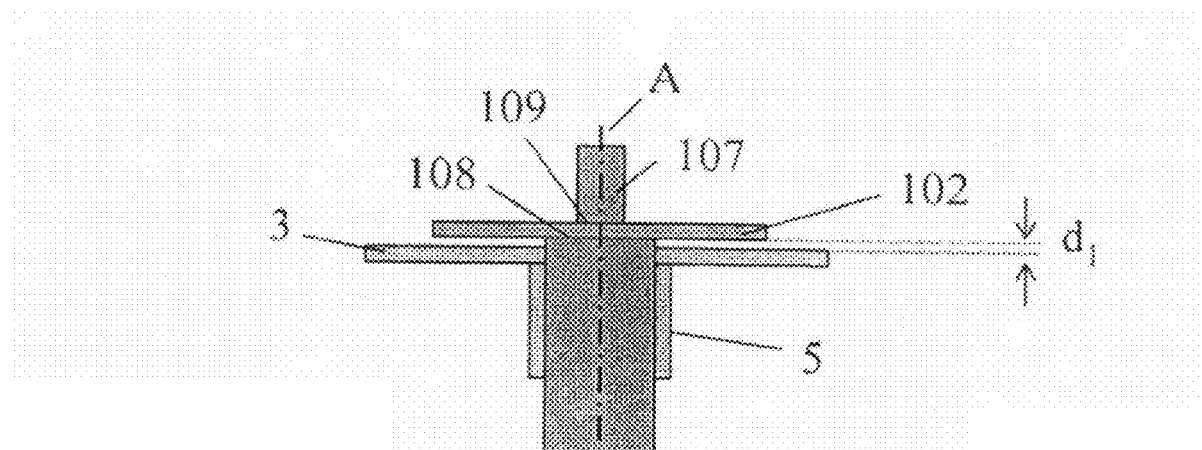
FIG. 2a is a schematic illustration of an alternative way of holding a substrate according to the present invention, with disk and substrate being relatively close together.
Figure 2B:
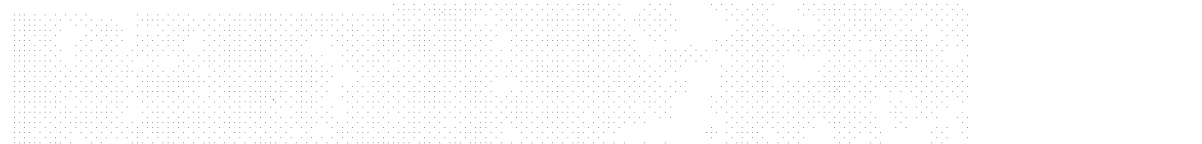
FIG. 2b is a schematic illustration similar to that of FIG. 2a at a time point at which a gripper system lifts the substrate from the device or places it onto the device.

FIGS. 2a and 2b show a further alternative out of a plurality of possible alternatives for holding the substrate 102. Therefore, only the new aspects of holding the substrates 102 are discussed here. In view of the remaining characteristics, reference is made to the description of FIGS. 1a, 1b and 1c. This alternative holding and rotating means is suitable for substrates 102 which do not have a central hole. According to FIG. 2a, the substrate 102 rests with a first side (in FIG. 2a the lower side) on a support surface 108. A counter pressure element 107 presses with a counter surface 109 against the second side (in FIG. 2a the upper side) of the substrate 102. Thus, the substrate 102 is clamped between the two surfaces 108 and 109. The counter surface 109 of the counter pressure element 107 has a sufficiently small diameter (as compared to the substrate 102), so that the process of coating the substrate 102 is not disturbed.

FIG. 2b shows, again analogously to FIG. 1c, the loading and unloading of a substrate 102 into and out of the device according to the invention by means of a conventional gripper system 6.

A further alternative of holding the substrate 102 can be suction cups (not shown). For this purpose, the substrate 102 is sucked to the support surface 108 by means of suction cups. A centering pin 1 or a counter pressure element 107 is not necessary in this case.

The invention claimed is:

1. A device for coating a substrate (2; 102) by spinning-off the coating material, comprising:
   holding and rotating means for holding and rotating the substrate (2; 102) about an axis (A) essentially perpendicular with respect to the substrate plane;
   a disk (3) which is arranged below the substrate (2; 102) and coaxially thereto and which has at least the same diameter as the substrate (2; 102), and
   distance varying means (4) for varying the distance (d) between substrate (2; 102) and disk (3),
   wherein the disk (3) has a hole coaxially with respect to the axis (A), and the distance varying means (4) extends through the hole for supporting the substrate (2, 102) and can be elongated or is movable relative to the disk (3); and
   wherein the distance varying means (4) is configured as the holding and rotating means; and
   wherein the holding and rotating means comprises a centering pin (1) for engagement with an axial bore of the substrate (2).

2. The device according to claim 1, comprising means for rotating the disk (3) synchronously with the substrate (2; 102) about the axis (A).

3. The device according to claim 1, wherein the disk (3) is axially movable relative to the distance varying means (4) by means of a disk holder (5).

4. The device according to claim 1 wherein the holding and rotating means is configured as clamping means for pressing coaxially against both sides of the substrate (102).

5. A device for coating a substrate (2; 102) by spinning-off the coating material, comprising:
   holding and rotating means for holding and rotating the substrate (2; 102) about an axis (A) essentially perpendicular with respect to the substrate plane;
   a disk (3) which is arranged below the substrate (2; 102) and coaxially thereto and which has at least the same diameter as the substrate (2; 102), and
   distance varying means (4) for varying the distance (d) between substrate (2; 102) and disk (3); and
   wherein the disk (3) has a hole coaxially with respect to the axis (A), and the distance varying means (4) extends through the hole for supporting the substrate (2, 102) and can be elongated or is movable relative to the disk (3); and wherein the distance varying means (4) is configured as the holding and rotating means;

wherein the distance (d) between the substrate (2; 102) and the disk (3) is 0.1 to 0.3 mm, during the coating process.

6. The device according to claim 5, comprising means for rotating the disk (3) synchronously with the substrate (2; 102) about the axis (A).

7. The device according to claim 5, wherein the disk (3) is axially movable relative to the distance varying means (4) by means of a disk holder (5).

8. The device according to claim 5, wherein the holding and rotating means comprises a centering pin (1) for engagement with an axial bore of the substrate (2).

9. A device for coating a substrate (2; 102) by spinning-off the coating material, comprising:

holding and rotating means for holding and rotating the substrate (2; 102) about an axis (A) essentially perpendicular with respect to the substrate plane;

a disk (3) which is arranged below the substrate (2; 102) and coaxially thereto and which has at least the same diameter as the substrate (2; 102), and distance varying means (4) for varying the distance (d) between substrate (2; 102) and disk (3); and wherein the disk (3) has a hole coaxially with respect to the axis (A), and the distance varying means (4) extends through the hole for supporting the substrate (2, 102) and can be elongated or is movable relative to the disk (3); and wherein the distance varying means (4) is configured as the holding and rotating means; and wherein the holding and rotating means is configured as clamping means for pressing coaxially against both sides of the substrate (102).

10. The device according to claim 9 wherein the distance (d) between the substrate (2; 102) and the disk (3) is 0.1 to 0.3 mm, during the coating process.

11. The device according to claim 9 comprising means for rotating the disk (3) synchronously with the substrate (2; 102) about the axis (A).

12. The device according to claim 9 wherein the disk (3) is axially movable relative to the distance varying means (4) by means of a disk holder (5).

* * * * *